US008592990B2

(12) United States Patent
Chikaki et al.

(10) Patent No.: US 8,592,990 B2
(45) Date of Patent: Nov. 26, 2013

(54) SEMICONDUCTOR DEVICE AND METHOD OF MANUFACTURING SEMICONDUCTOR DEVICE

(75) Inventors: Shinichi Chikaki, Kanagawa (JP); Takahiro Nakayama, Ibaraki (JP)

(73) Assignees: Renesas Electronics Corporation, Kanagawa (JP); ULVAC, Inc., Kanagawa (JP)

( * ) Notice: Subject to any disclaimer, the term of this patent is extended or adjusted under 35 U.S.C. 154(b) by 151 days.

(21) Appl. No.: 13/193,154

(22) Filed: Jul. 28, 2011

(65) Prior Publication Data

US 2012/0025395 A1    Feb. 2, 2012

(30) Foreign Application Priority Data

Jul. 29, 2010    (JP) ................................ 2010-170099

(51) Int. Cl.
*H01L 23/52*    (2006.01)
*H01L 23/48*    (2006.01)
*H01L 29/40*    (2006.01)

(52) U.S. Cl.
USPC .................. 257/774; 257/E21.577; 257/642; 257/759; 438/638; 438/780

(58) Field of Classification Search
USPC .......... 257/E21.577, E23.167, 639, 640, 642, 257/643, 759, 762, 774; 438/82, 638, 725, 438/780
See application file for complete search history.

(56) References Cited

U.S. PATENT DOCUMENTS

| 6,528,409 | B1 * | 3/2003 | Lopatin et al. | 438/618 |
| 6,699,797 | B1 * | 3/2004 | Morris et al. | 438/778 |
| 6,703,324 | B2 * | 3/2004 | Wong | 438/787 |
| 6,759,325 | B2 * | 7/2004 | Raaijmakers et al. | 438/633 |
| 6,958,525 | B2 * | 10/2005 | Nakata et al. | 257/642 |
| 7,015,150 | B2 * | 3/2006 | Cooney et al. | 438/765 |
| 7,018,920 | B2 * | 3/2006 | Meagley et al. | 438/629 |
| 7,125,794 | B2 | 10/2006 | Kondo et al. | |
| 7,294,931 | B2 * | 11/2007 | Barns | 257/753 |
| 7,332,449 | B2 * | 2/2008 | Wang et al. | 438/704 |
| 7,459,398 | B2 * | 12/2008 | Minamihaba et al. | 438/692 |
| 7,527,723 | B2 * | 5/2009 | Kobata et al. | 205/668 |
| 7,732,349 | B2 * | 6/2010 | Yamamoto | 438/783 |
| 7,922,824 | B2 * | 4/2011 | Minsek et al. | 134/1.3 |
| 7,972,954 | B2 * | 7/2011 | Weber | 438/618 |

FOREIGN PATENT DOCUMENTS

JP    2005-117026 A    4/2005

OTHER PUBLICATIONS

N. Hata et al., "Analysis of Pore Structures in Ultra Low-k Dielectrics," Extended Abstracts of the 2002 International Conference on Solid State Devices and Materials, IEEE Electron Devices Society, Sep. 17-19, 2002, The Japan Society of Applied Physics.

* cited by examiner

*Primary Examiner* — Chris Chu
(74) *Attorney, Agent, or Firm* — Sughrue Mion, PLLC

(57) ABSTRACT

A semiconductor device includes: a first porous layer that is formed over a substrate and includes a $SiO_2$ skeleton; a second porous layer that is formed immediately above the first porous layer and includes a $SiO_2$ skeleton; a via wiring that is provided in the first porous layer; and a trench wiring that is buried in the second porous layer. The first porous layer has a pore density $x_1$ of 40% or below and the second porous layer has a pore density $x_2$ of $(x_1+5)$ % or above.

7 Claims, 9 Drawing Sheets

SEMICONDUCTOR DEVICE AND METHOD OF MANUFACTURING SEMICONDUCTOR DEVICE

This application is based on Japanese patent application No. 2010-170099, the content of which is incorporated hereinto by reference.

BACKGROUND

1. Technical Field

The present invention relates to a semiconductor device and a method of manufacturing a semiconductor device.

2. Related Art

In some cases, an interlayer dielectric, such as a via dielectric having a via wiring provided therein or a trench dielectric having a trench wiring provided therein, requires a low dielectric constant (Low-k). There is a semiconductor device in which an interlayer dielectric is a porous layer in order to reduce dielectric constant.

However, in this case, the mechanical strength of the interlayer dielectric is reduced. For example, when chemical mechanical polishing (CMP) is performed after a metal material is buried, a layer structure is likely to be destroyed. In addition, in some cases, the adhesion between the interlayer dielectric and a layer coming into contact with the interlayer dielectric is reduced and the dielectric is likely to peel off.

As a means for solving the above-mentioned problems, for example, there is a technique disclosed in Japanese Unexamined Patent Publication No. 2005-117026. In the technique disclosed in Japanese Unexamined Patent Publication No. 2005-117026, the process (for example, the application of a solution and drying) that has been performed once in order to form a porous layer is performed two or more times. In this way, it is possible to appropriately distribute pores in the porous layer. As a result, it is possible to prevent the porous layer from peeling off.

In the technique disclosed in Japanese Unexamined Patent Publication No. 2005-117026, it is difficult to sufficiently improve the mechanical strength of the interlayer dielectric. The inventors conducted a study on a technique capable of reducing the dielectric constant of an interlayer dielectric and improving the mechanical strength of the interlayer dielectric. As a result, the inventors found the following problems.

(1) Raw Material

In general, in the case of a raw material (for example, a silsesquioxane resin (SiOC)) used for a low-dielectric constant (low-k) porous layer, the network of "—Si—O—Si—" is terminated by C. As a result, the mechanical strength of the layer is reduced. When C is incorporated into the network, for example, "—O—Si—C—Si—" is formed. As a result, the raw material is close to "SiC", which is a semiconductor, and leakage current increases.

(2) Difference in Structure Between Via Dielectric and Trench Dielectric

In general, each of the via dielectric and the trench dielectric includes an interlayer dielectric and a metal layer. The occupancy of the interlayer dielectric in the via dielectric is larger than that of the interlayer dielectric in the trench dielectric. For example, in some cases, the volume ratio of the interlayer dielectric in the via dielectric is 10 to 1000 times larger than the volume ratio of the interlayer dielectric in the trench dielectric. Mechanical strength to destroy each layer is determined by, for example, the mechanical strength of each of the interlayer dielectric, the trench wiring, and the via wiring, the volume ratio of each layer, and the adhesion strength between the interlayer dielectric and the trench wiring or the via wiring. In many cases, destruction occurs in the interlayer dielectric whose mechanical strength is about a fraction of the mechanical strength of the trench wiring and the via wiring. Therefore, the via dielectric in which the occupancy of the interlayer dielectric is needs to have higher mechanical strength. However, when the via dielectric and the trench dielectric are designed in the same way without considering the above, the flexibility of the design is reduced and it is difficult to obtain sufficient dielectric constant and mechanical strength.

The inventors achieved the invention considering the above-mentioned problems.

SUMMARY

In one embodiment, there is provided a semiconductor device including: a first porous layer that is formed over a substrate and includes a $SiO_2$ skeleton; a second porous layer that is formed immediately above the first porous layer and includes a $SiO_2$ skeleton; a via wiring that is provided in the first porous layer; and a trench wiring that is buried in the second porous layer. The first porous layer has a pore density $x_1$ of 40% or below and the second porous layer has a pore density $x_2$ of $(x_1+5)$ % or above. The "pore density" is synonymous with a porosity (volume porosity). This premise is the same as that in the following "pore density".

In the embodiment of the invention, each of the first porous layer and the second porous layer is a porous layer including a $SiO_2$ skeleton. Therefore, it is possible to form a low-k porous layer with high mechanical strength and low dielectric constant, as compared to a porous layer having, for example, SiOC as a raw material.

In the embodiment of the invention, the pore density $x_1$ of the first porous layer having the via wiring provided therein is different from the pore density $x_2$ of the second porous layer having the trench wiring provided therein. Specifically, the pore density $x_1$ of the first porous layer is equal to 40% or below and the pore density $x_2$ of the second porous layer is equal to $(x_1+5)$ % or above.

As pore density increases, dielectric constant is reduced, but mechanical strength is reduced. On the other hand, as pore density is reduced, mechanical strength increases, but dielectric constant increases.

In the embodiment of the invention, the pore density of each of the first porous layer and the second porous layer is not determined in a uniform way, but the pore density is appropriately determined according to the performance required for each layer. Therefore, it is possible to obtain a low-k interlayer dielectric with high mechanical strength.

In another embodiment, there is provided a method of manufacturing a semiconductor device. The method includes: applying a first solution including a surfactant onto a substrate and heating the first solution to form a first porous layer; applying the first solution onto the first porous layer and heating the first solution to form a second porous layer; and forming a via wiring in the first porous layer and forming a trench wiring in the second porous layer after said step of forming the second porous layer.

In the manufacturing method according to the embodiment of the invention, the same solution is applied twice. During the second applying process, the solution is infiltrated into the previously formed porous layer to form a layered structure of the layers with different pore densities. In this case, it is not necessary to produce a plurality of solutions. Therefore, it is possible to reduce manufacturing costs and improve work efficiency.

In the manufacturing method according to the embodiment of the invention, it is possible to form an interlayer dielectric including a lower layer with high dielectric constant and an upper layer with low dielectric constant with the minimum number of processes. Therefore, it is possible to manufacture a multi-layer semiconductor integrated circuit device including many trench wiring layers at a low cost. In addition, it is possible to provide a low-k film with high mechanical strength and adhesion. Therefore, it is possible to reduce the power consumption of a circuit and increase the operation speed of the circuit. As a result, it is possible to manufacture an integrated circuit device with high reliability.

According to the above-mentioned embodiments of the invention, it is possible to achieve a semiconductor device including a low-k interlayer dielectric with high mechanical strength.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
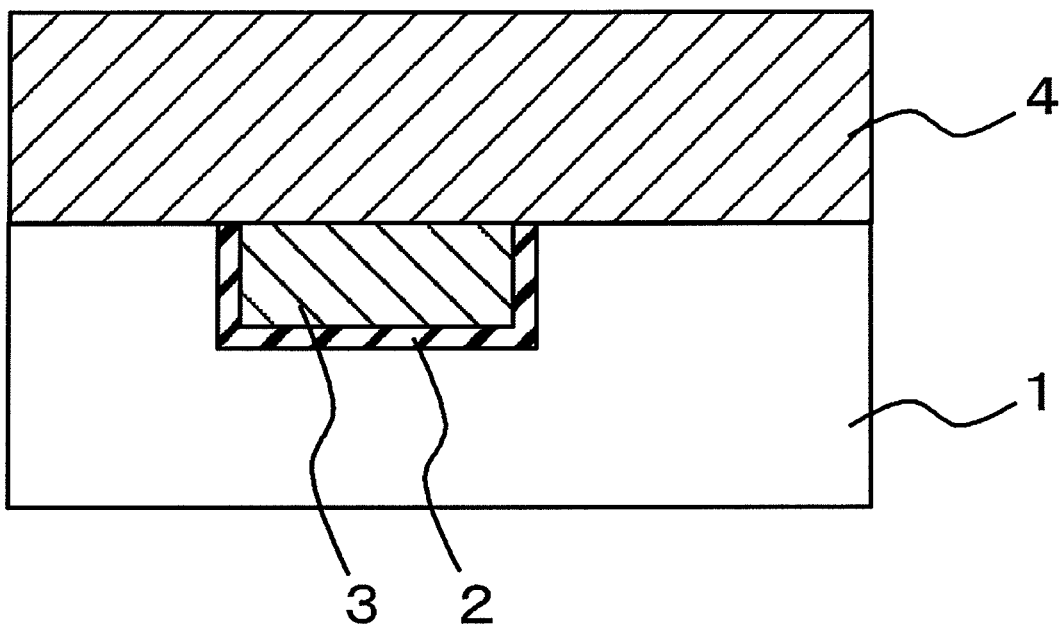
FIG. 1 is a cross-sectional view illustrating a process of manufacturing a semiconductor device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the invention will be described in detail with reference to the accompanying drawings. All of the following drawings schematically illustrate the embodiments of the invention. In the drawings, the dimensions of the structure according to the embodiments of the invention are not defined by the scale of components on the drawings as long as they are not particularly described. The same components are denoted by the same reference numerals and a description thereof will not be repeated.

Figure 7:
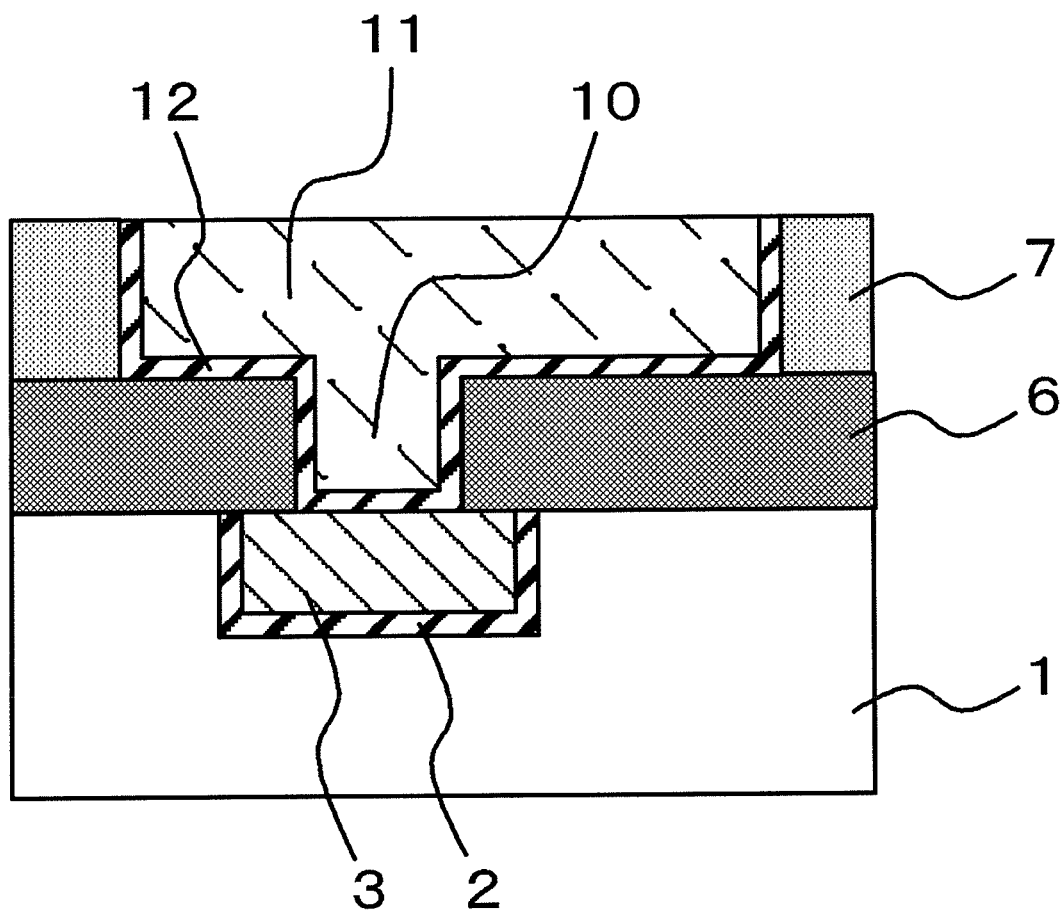
FIG. 7 is a cross-sectional view illustrating an example of the semiconductor device according to this embodiment.

FIG. 7 is a cross-sectional view schematically illustrating an example of a semiconductor device according to an embodiment. As shown in FIG. 7, in the semiconductor device according to this embodiment, a via dielectric 6 is formed on a under layer 1 which is formed on a substrate (not shown), and a trench dielectric 7 is formed on the via dielectric 6. An under layer wiring 3 is buried in the under layer 1 through a barrier film 2. A via wiring 10 is provided in the via dielectric 6 through a barrier film 12. An trench wiring 11 is buried in the trench dielectric 7 through the barrier film 12.

The via dielectric 6 is a porous layer including a $SiO_2$ skeleton and has a pore density of 40% or below. The trench dielectric 7 is a porous layer including a $SiO_2$ skeleton. When the pore density of the via dielectric 6 is $x_1$%, the pore density of the trench dielectric 7 is equal to $(x_1+5)$% or above and preferably equal to $(x_1+10)$% or above. The trench dielectric 7 is formed immediately above the via dielectric 6 and no film is interposed between the trench dielectric 7 and the via dielectric 6.

The structure of the under layer 1 is not particularly limited. For example, the under layer 1 may have the same structure as the trench dielectric 7. In this case, for example, a stopper film (not shown) may be interposed between the under layer 1 and the via dielectric 6. The structure of the stopper film is not particularly limited. The stopper film may have any structure according to the related art. This premise is the same as that in all of the following stopper films.

The structure of the barrier films 2 and 12 is not particularly limited. For example, a tantalum film or a layered film of a tantalum film and a copper film may be used as the barrier film. The structure of the via wiring 10 and the trench wiring 11 is not particularly limited. For example, the via wiring 10 and the trench wiring 11 may be made of copper.

A layered structure having a second via dielectric (not shown) and a second trench dielectric (not shown) formed in this order may be formed on the trench dielectric 7. The layered structure having the second via dielectric and the second trench dielectric may have the same configuration as the layered structure having the via dielectric 6 and the trench dielectric 7. In this case, for example, a stopper film (not shown) may be interposed between the trench dielectric 7 and the second via dielectric (not shown) formed on the trench dielectric 7.

Next, the operation and effect of the semiconductor device according to this embodiment will be described.

In this embodiment, each of the via dielectric 6 and the trench dielectric 7 is a porous layer including a $SiO_2$ skeleton. Therefore, it is possible to form a low-k porous layer with high mechanical strength and adhesion, and low dielectric constant, as compared to a porous layer made of, for example, SiOC.

In this embodiment, the pore density of the via dielectric 6 is different from that of the trench dielectric 7. Specifically, the pore density of the via dielectric 6 is equal to 40% or below. When the pore density of the via dielectric 6 is $x_1$%, the pore density of the trench dielectric 7 is equal to $(x_1+5)$% or above and preferably equal to $(x_1+10)$% or above.

When the relative dielectric constant of the porous layer with a pore density of x(%) is k, the pore density of the layer may be calculated by the following Expression 1 disclosed in N. Hata, C. Negoro, K. Yamada, H. S. Zhou, Y. Oku, T. Kikkawa Ext. Abst 2002 Int. Conf. Solid State Devices and Materials (Business Center for Academic Societies Japan, Tokyo, 2002) pp. 496-497 after the relative dielectric constant is measured:

$$k = \frac{(k_s + 2) + 2(1-x)(k_s - 1)}{(k_s + 2) - (1-x)(k_s - 1)}$$ [Expression 1]

$k_s$ is a relative dielectric constant if the layer does not include a pore, that is, the relative dielectric constant of a porous material. In addition, if pores are formed in the entire layer, the dielectric constant k is 1.

The thickness of the porous layer formed on the silicon substrate is measured by a spectroscopic ellipsometer (GES-5E manufactured by SOPRA, Inc.) and the capacitance of the porous layer is measured by a mercury probe (CVmap3093 manufactured by Four Dimensions Inc.), thereby calculating the relative dielectric constant. In order to measure the mechanical strength of the layer, the Young's modulus is measured by a Nano Indenter (MTS Systems Corporation) using a nanoindentation method.

Figure 8:
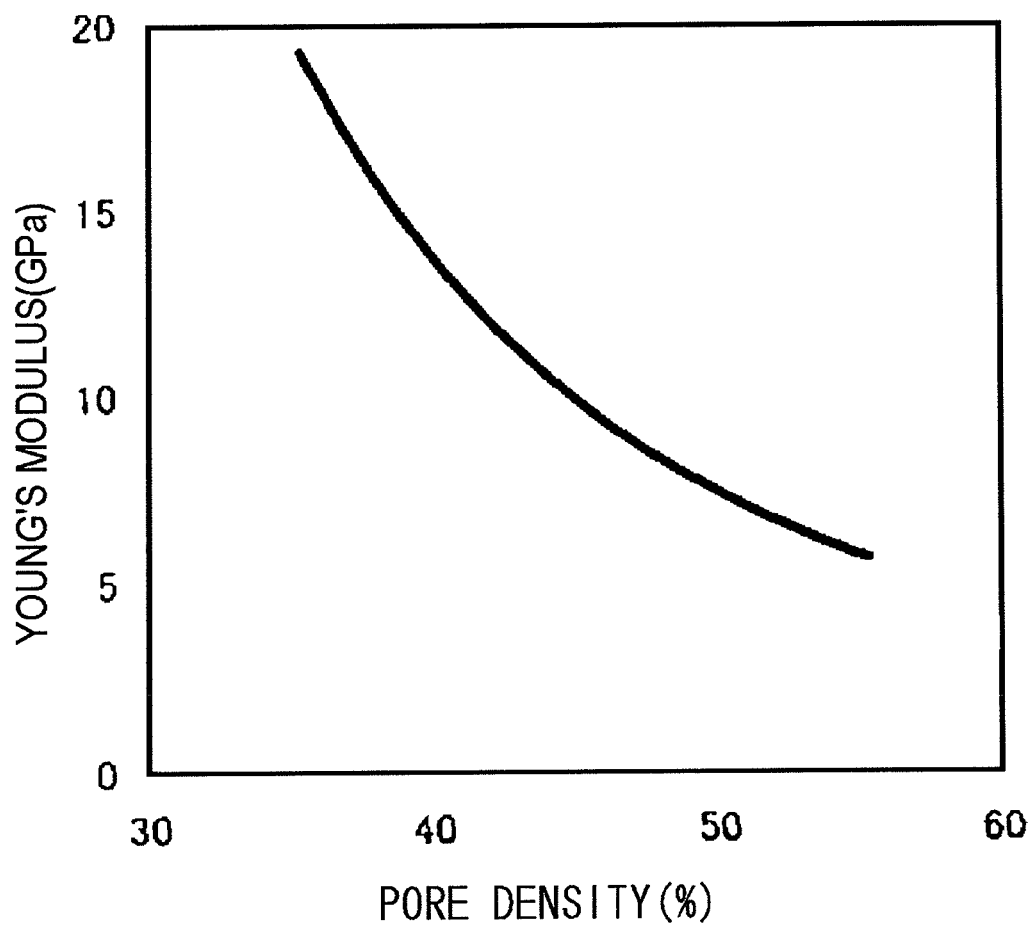
FIG. 8 is a diagram illustrating the effect of the semiconductor device according to this embodiment.

FIG. 8 is a diagram illustrating the measurement result and shows the relationship between the Young's modulus and the pore density of the porous layer. As can be seen from FIG. 8, the Young's modulus is reduced as the pore density increases.

The pattern density of the via wiring 10 provided in the via dielectric 6 is small. Therefore, the mechanical strength of the via dielectric 6 is dominant in the mechanical strength of the layer including the via dielectric 6 and the via wiring 10. The inventors examined, for example, the load applied to the via dielectric 6 during CMP after the via hole and the trench were filled with Cu. The examination result proved that the via dielectric 6 required a Young's modulus of 15 GPa or above. As can be seen from the relationship shown in FIG. 8, when the pore density of the via dielectric 6 is equal to 40% or below, the via dielectric 6 satisfying the Young's modulus, that is, the via dielectric 6 having desired mechanical strength and adhesion is obtained. When the pore density of the via dielectric 6 is 40%, the via dielectric 6 can have both mechanical strength and adhesion satisfying a desired required performance (sufficient resistance to CMP) and a sufficiently low dielectric constant.

The percentage of the trench wiring 11 in the trench dielectric 7 is relatively high. Therefore, the strength of the trench wiring 11 is dominant in the mechanical strength of the layer including the trench dielectric 7 and the trench wiring 11. The inventors examined, for example, the load applied to the trench dielectric 7 during CMP after the via hole and the trench were filled with Cu. The examination result proved that there was no problem even when the Young's modulus of the trench dielectric 7 was equal to 10 GPa or below. That is, from the relationship shown in FIG. 8, the pore density of the trench dielectric 7 can be equal to 40% or above. As a result, it is possible to obtain a sufficiently low dielectric constant. When the pore density of the via dielectric 6 is $x_1$%, the pore density of the trench dielectric 7 is equal to $(x_1+5)$ % or above and more preferably equal to $(x_1+10)$ % or above. In this way, the trench dielectric 7 can have both mechanical strength and adhesion satisfying a desired required performance (sufficient resistance to CMP) and a sufficiently low dielectric constant.

As such, in the semiconductor device according to this embodiment, the porous layers with appropriate pore density are formed according to the performances required for the via dielectric 6 and the trench dielectric 7. In this way, a semiconductor device with high mechanical strength and adhesion, and a sufficiently low dielectric constant is achieved.

Next, an example of a method of manufacturing the semiconductor device according to this embodiment will be described.

Figure 9:
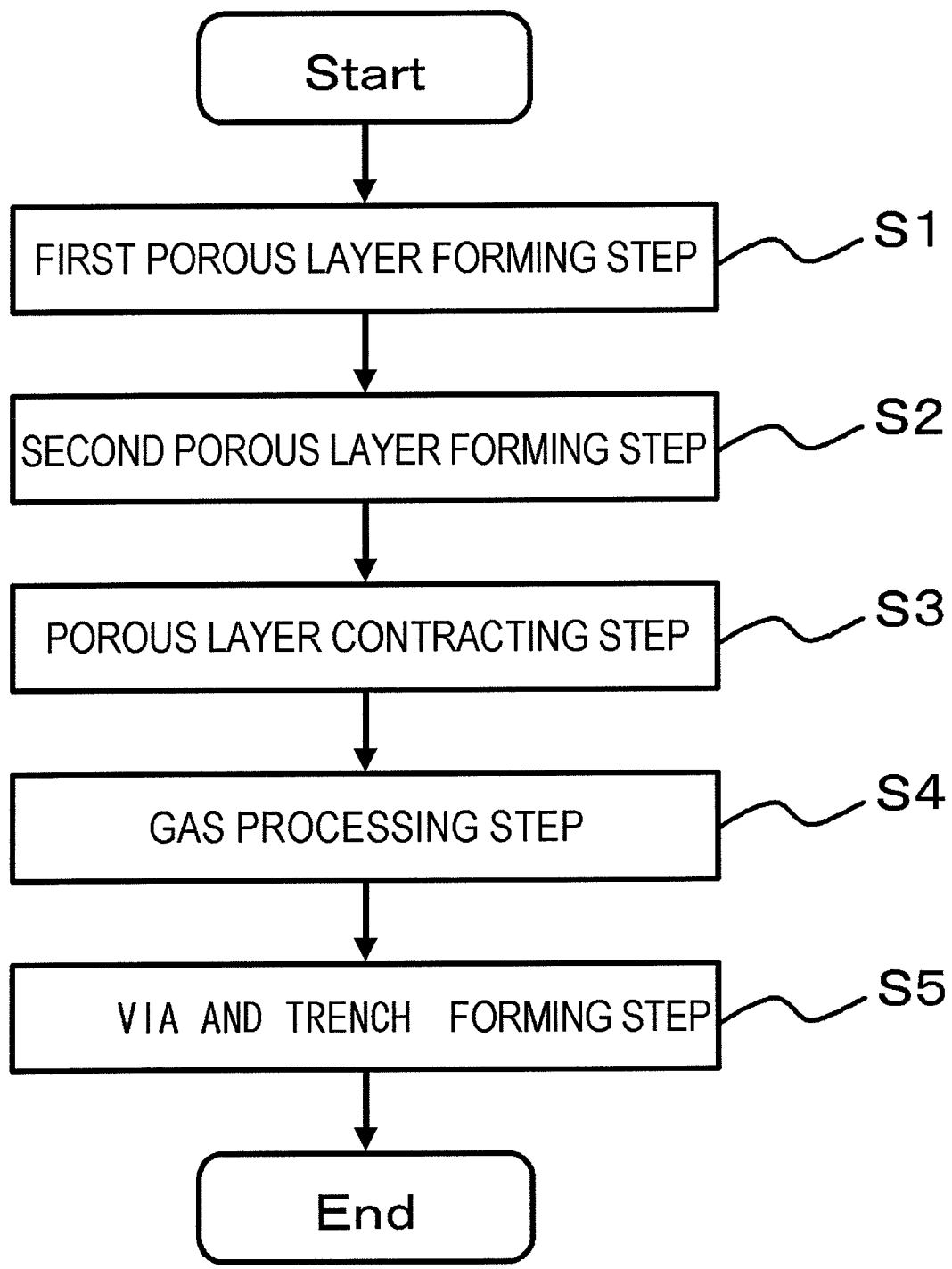
FIG. 9 is a flowchart illustrating an example of a method of manufacturing the semiconductor device according to this embodiment.

FIG. 9 is a flowchart illustrating an example of the procedure of the method of manufacturing the semiconductor device according to this embodiment.

As shown in FIG. 9, the method of manufacturing the semiconductor device according to this embodiment includes a first porous layer forming step S1, a second porous layer forming step S2, a porous layer contracting step S3, a gas processing step S4, and a via wiring and trench wiring forming step S5.

The manufacturing method may not include the porous layer contracting step S3 and/or the gas processing step S4. When the manufacturing method includes both the porous layer contracting step S3 and the gas processing step S4, the anteroposterior relationship between the steps is not limited to that shown in FIG. 9. For example, the porous layer contracting step S3 may be performed after the gas processing step S4.

Figure 2:
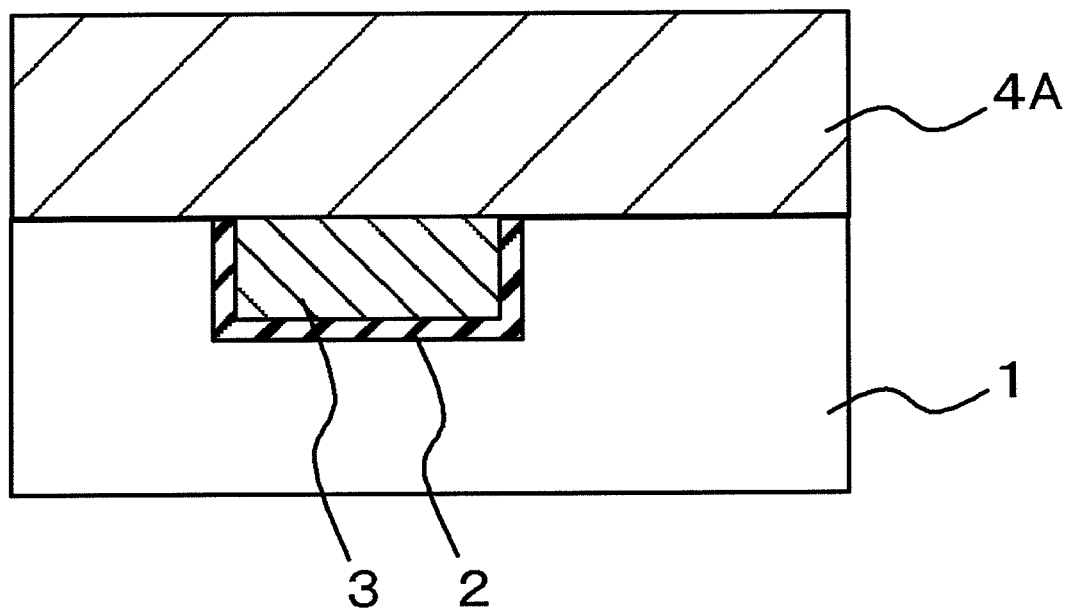
FIG. 2 is a cross-sectional view illustrating the process of manufacturing the semiconductor device according to this embodiment.

In the first porous layer forming step S1, as shown in FIG. 1, a first solution 4 including a surfactant is applied onto a substrate (not shown) and is then heated to form the first porous layer 4A, as shown in FIG. 2.

The first solution 4 includes a siloxane oligomer and a surfactant as the main components. The kind of surfactant is not particularly limited. It is preferable that the thermal decomposition temperature of the surfactant be equal to 100° C. or above. After the first solution 4 is applied, it is heated at a temperature that is equal to or higher than the thermal decomposition temperature of the surfactant. In this case, the surfactant is thermally decomposed and pores are formed at the positions where there are micelles formed by the surfactant. As a result, the first porous layer 4A is formed.

Figure 3:
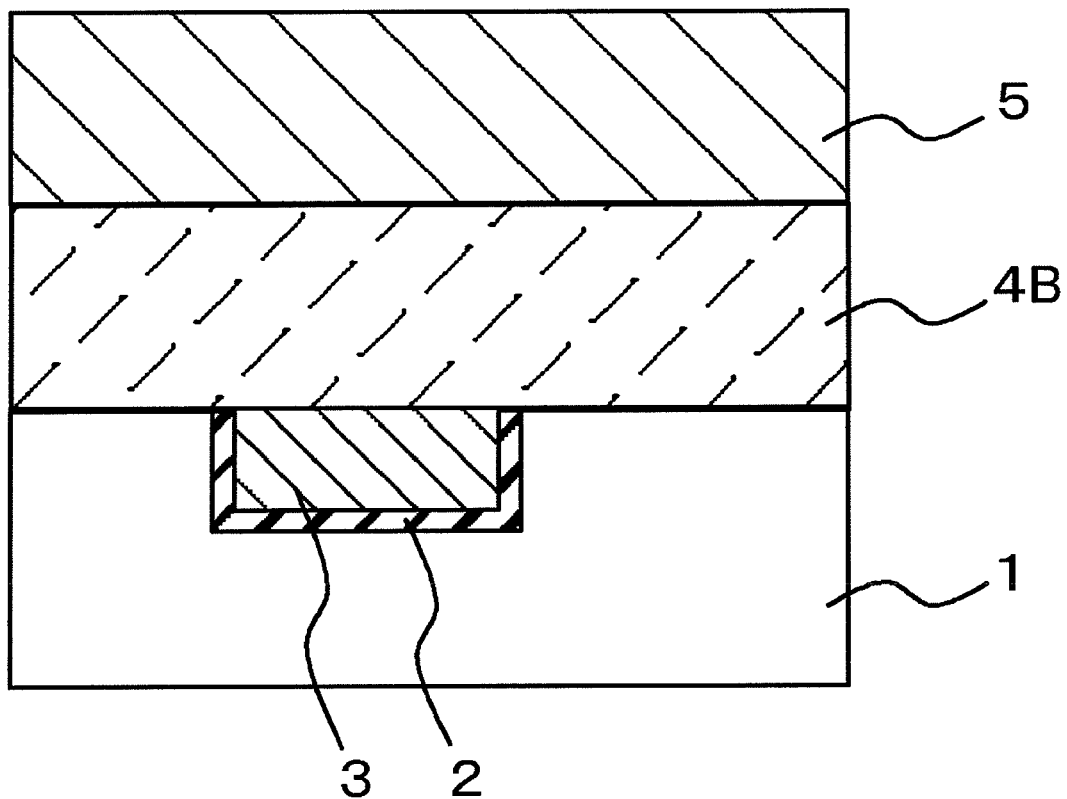
FIG. 3 is a cross-sectional view illustrating the process of manufacturing the semiconductor device according to this embodiment.
Figure 4:
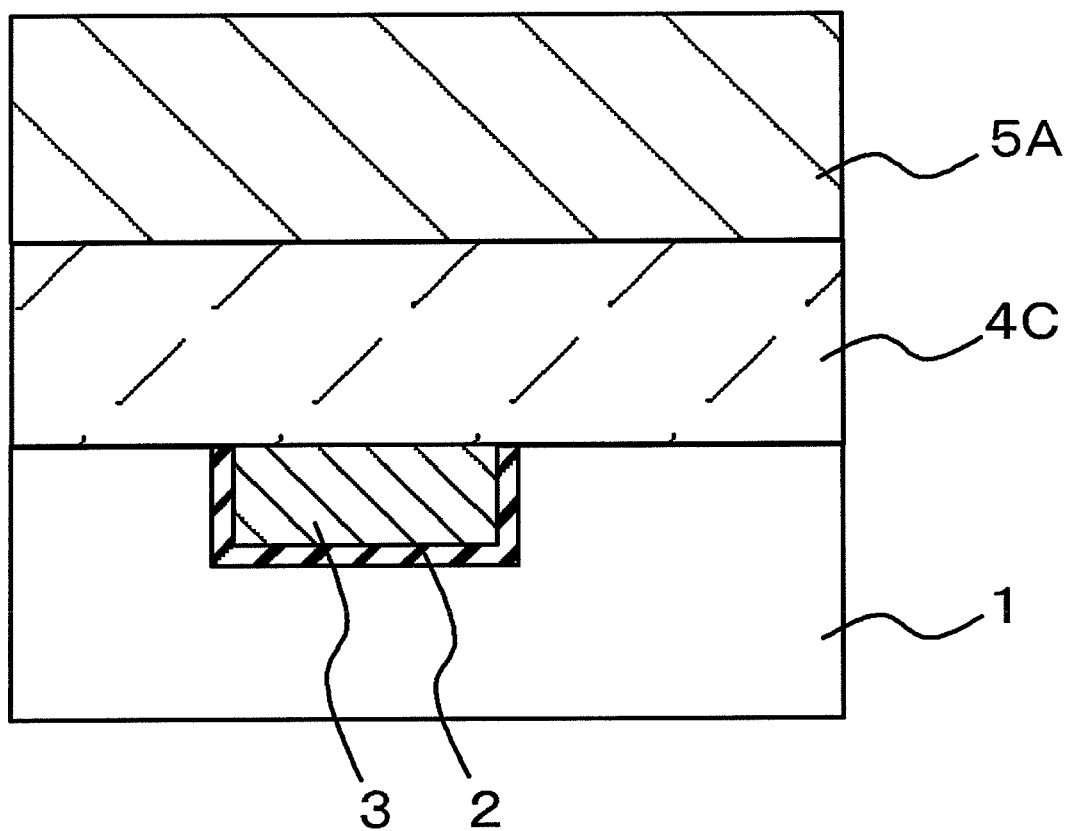
FIG. 4 is a cross-sectional view illustrating the process of manufacturing the semiconductor device according to this embodiment.

In the second porous layer forming step S2, as shown in FIG. 3, a first solution 5 is applied onto the first porous layer 4A and is then heated to form the second porous layer 5A, as shown in FIG. 4.

The first solution 5 may be the same as the first solution 4 used to form the first porous layer 4A. When the first solution 5 is applied onto the first porous layer 4A, the first solution 5 gets into the pores of the first porous layer 4A. That is, the first solution 5 gets into the pores of the first porous layer 4A to form the first porous layer 4B. Then, the applied first solution 5 is heated after the first solution 5 is infiltrated into the first porous layer 4A, preferably after a sufficient amount of time required for the first solution 5 to be completely infiltrated into the first porous layer 4A has elapsed.

After the first solution 5 is applied, it is heated at a temperature that is equal to or higher than the thermal decomposition temperature of the surfactant. In this case, the surfactant is thermally decomposed and pores are formed at the positions where there are micelles formed by the surfactant. As a result, a first porous layer 4C and a second porous layer 5A are formed (see FIG. 4).

In this case, it is possible to adjust the density of the pores in the first porous layers 4A and 4C and the second porous layer 5A according to the content of the surfactant in the first solutions 4 and 5. In this embodiment, the pore density of the first porous layer 4C is equal to 40% or below. When the pore density of the first porous layer 4C is $x_1$%, the pore density of the first porous layer 4A and the second porous layer 5A is adjusted so as to be equal to $(x_1+5)$ % or above and preferably equal to $(x_1+10)$ % or above.

In the porous layer contracting step S3, at least one of ultraviolet rays, an electron beam, and a microwave is emitted to the first porous layer 4C and the second porous layer 5A while the first porous layer 4C and the second porous layer 5A are heated.

The heating may be performed at a temperature of equal to 100° C. or above and equal to 600° C. or below and preferably equal to 150° C. or above and equal to 450° C. or below. The ultraviolet rays with a wavelength of, for example, equal to 150 nm or above and equal to 300 nm or below may be emitted with an intensity of equal to 0.4 J/cm$^2$ or above and equal to 20 J/cm$^2$ or below and preferably equal to 1 J/cm$^2$ or above and equal to 10 J/cm$^2$ or below. The electron beam may be emitted with an energy of equal to 1 keV or above and equal to 25 keV or below and preferably equal to 10 keV or above and equal to 15 keV or below and a dose of equal to 10$^{-3}$ C/cm$^2$ or above and equal to 10$^5$ C/cm$^2$ or below for a time equal to 10 seconds or above and equal to 10 minutes or below. The microwaves may be emitted with an energy of equal to 50 W or above and equal to 5000 W or below and preferably equal to 100 W or above and equal to 500 W or below for a time equal to 10 seconds or above and equal to 60 minutes or below and preferably equal to 10 seconds or above and equal to 10 minutes or below. In this embodiment, the heating condition and the emission condition in which the contraction ratio of each of the first porous layer 4C and the second porous layer 5A is about equal to 10% or above and equal to 40% or below may be appropriately selected.

Non-bonded portions of the SiO$_2$ component, which is a skeleton of each of the first porous layer 4C and the second porous layer 5A, are cross-linked by the above-mentioned process to improve mechanical strength.

In the gas processing step S4, the first porous layer 4C and the second porous layer 5A are heated in an atmosphere including organic silicon compounds in gas molecules. As the gas molecule, for example, organosiloxanes, such as tetramethylcyclotetrasiloxane, octamethylcyclotetrasiloxane, hexamethyldisiloxane, or hexamethyldisilazane, or a silyation agent is used.

The heating may be performed at a temperature of equal to 150° C. or above and equal to 600° C. or below and preferably equal to 200° C. or above and equal to 450° C. or below.

This process can change a Si—OH component, which is an end group of a surface portion of each of the first porous layer 4C and the second porous layer 5A having a SiO$_2$ component as a skeleton, into Si—H or Si—CH$_3$, thereby reducing dielectric constant.

In the via wiring and trench wiring forming step S5, a via wiring is provided in the first porous layer and a trench wiring is buried in the second porous layer.

Figure 5:
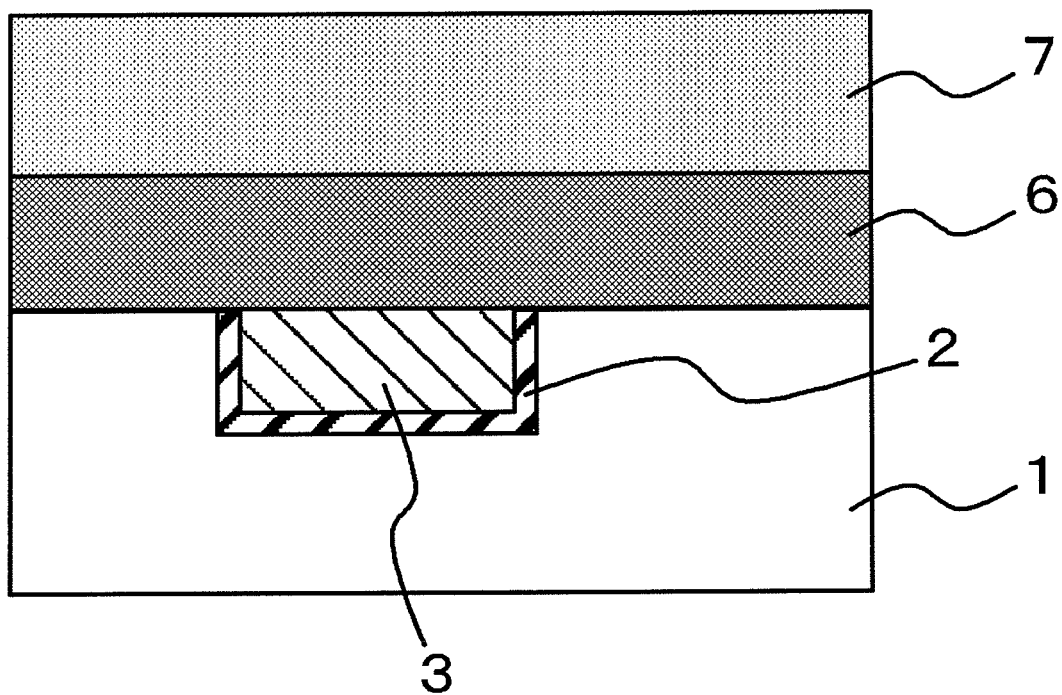
FIG. 5 is a cross-sectional view illustrating the process of manufacturing the semiconductor device according to this embodiment.
Figure 6:
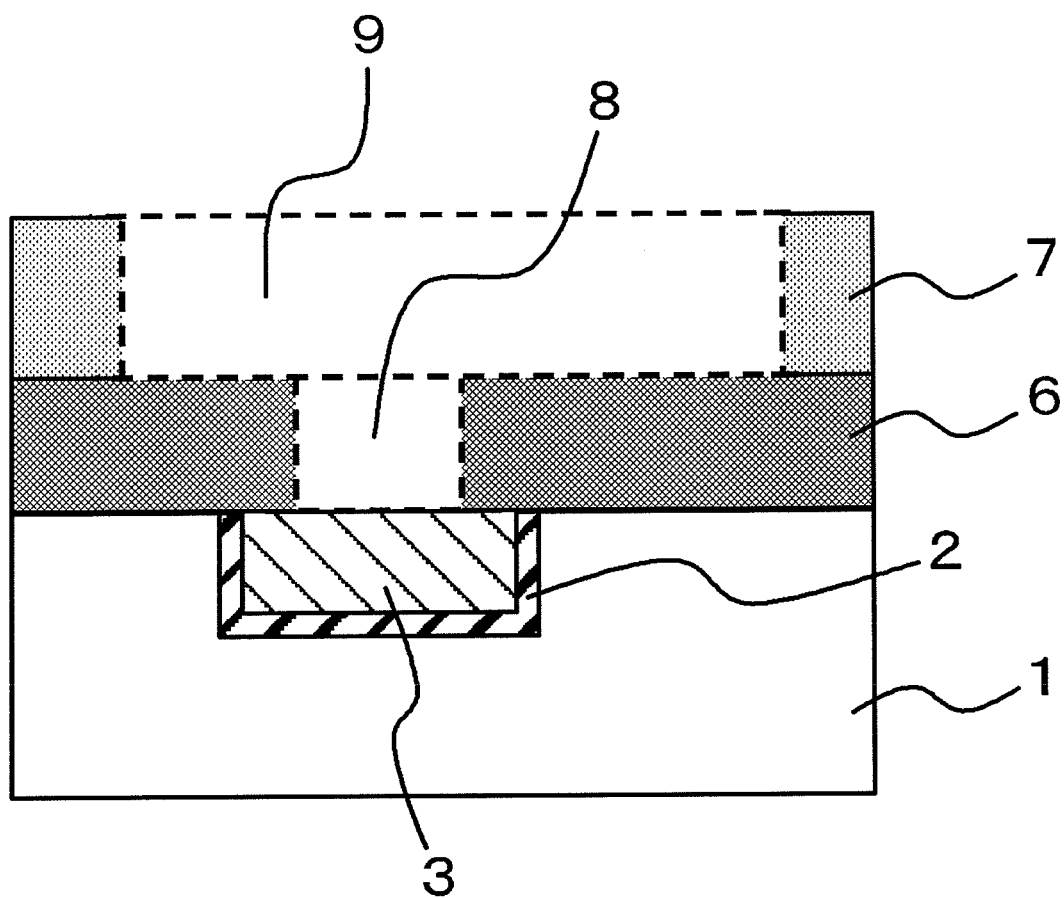
FIG. 6 is a cross-sectional view illustrating the process of manufacturing the semiconductor device according to this embodiment.

For example, in the first porous layer 6 and the second porous layer 7 (see FIG. 5) subjected to the steps S3 and/or S4, via hole 8 and trench 9 are formed by photolithography and etching (see FIG. 6). Then, the barrier film 12 (see FIG. 7) is formed along the side wall and the bottom of the via hole 8 and trench 9. Then, the via hole 8 and trench 9 are filled with metal and then CMP is performed. In this way, as shown in FIG. 7, the via wiring 10 can be provided in the first porous layer 6 and the trench wiring 11 can be buried in the second porous layer 7.

In the manufacturing method according to this embodiment, the same solution is applied twice (the first porous layer forming step S1 and the second porous layer forming step S2). During the second applying process, the solution is infiltrated into the previously formed porous layer (first porous layer 4A) to form a layered structure of the layers with different pore densities. In this case, it is not necessary to produce plural kinds of solutions. Therefore, it is possible to reduce manufacturing costs and improve work efficiency.

In the manufacturing method according to this embodiment, the micelle formed by the surfactant added in the solution is used as a mold of the pore. Therefore, it is possible to form a porous layer in which pores are uniformly dispersed with high density.

In the manufacturing method according to this embodiment, the porous layer contracting step S3 and/or the gas processing step S4 may be combined with each other to improve the mechanical strength of the first porous layer 6 and the second porous layer 7 and reduce dielectric constant.

In the manufacturing method according to this embodiment, it is possible to form an interlayer dielectric including a lower layer with high dielectric constant and an upper layer with low dielectric constant with the minimum number of processes. Therefore, it is possible to manufacture a multi-layer semiconductor integrated circuit device including many wiring layers at a low cost. In addition, it is possible to provide a low-k film with high mechanical strength and adhesion. Therefore, it is possible to reduce the power consumption of a circuit and improve the operation speed of the circuit. As a result, it is possible to manufacture an integrated circuit device with high reliability.

EXAMPLES

A solution (a ULKS-type application liquid manufactured by ULVAC, Inc.) including a methylsiloxane oligomer and a surfactant with a thermal decomposition temperature of 150° C. or below was applied onto a semiconductor substrate having a under layer interconnect formed thereon and then heated at 150° C. in a nitrogen atmosphere to form pores in the film. As a result, a first porous layer with a skeleton having silicon dioxide (SiO$_2$) or silanol (SiOH) as a main component was formed.

Then, the same solution as described above was applied onto the first porous layer and then heated to 400° C. in a nitrogen atmosphere in stages. As a result, a second porous layer was formed on the first porous layer. In addition, the solution was applied onto the first porous layer and was then left for a sufficient amount of time so as to be infiltrated into the first porous layer. Then, heating was performed.

Then, ultraviolet light was emitted from a xenon excimer light source to the first porous layer and the second porous layer under the condition of 4.5 J/cm$^2$ while heating was maintained at a temperature of 400° C. such that the first porous layer and the second porous layer were shrunk by about 10%. In addition, the layers were heated at 400° C. for 90 minutes in a tetramethylcyclotetrasiloxane vapor atmosphere. Tetramethylcyclotetrasiloxane was infiltrated into the first porous layer and the second porous layer through the pores. As a result, the amount of silanol component in the first porous layer and the second porous layer was reduced and a porous SiOCH film including silicon dioxide and methylsilicon (SiCH$_3$) was formed.

The composition change was analyzed by a method (FTIR method) of analyzing the infrared absorption spectrum of a plurality of films with different thicknesses which was formed on the silicon substrate by the above-mentioned method. The optical characteristics of these samples were examined by a spectroscopic ellipsometry method. The examination result proved that the refractive index of the first porous layer (lower layer) was higher than that of the second porous layer (upper layer). In addition, a mercury electrode was formed on the surface of the layer to analyze capacitance with the substrate. As a result, the dielectric constant of the first porous layer (lower layer) was 2.4 and the dielectric constant of the second porous layer (upper layer) was 2.1. Since the dielectric constant of a dense silicon dioxide was 4.2, each of the first porous layer (lower layer) and the second porous layer (upper layer) is a porous low-k layer including a SiO$_2$ skeleton. In addition, the pore density of the first porous layer and the pore density of the second porous layer calculated by Expression 1 were 38% and 48%, respectively. The Young's modulus of the first porous layer and the Young's modulus of the second porous layer measured by a nano indenter were 16 GPa and 8 GPa, respectively.

It is apparent that the present invention is not limited to the above embodiment, and may be modified and changed without departing from the scope and spirit of the invention.

What is claimed is:

1. A semiconductor device comprising:
   a first porous layer that is formed over a substrate and includes a SiO2 skeleton;
   a second porous layer that is formed immediately above the first porous layer and includes a SiO2 skeleton;
   a via wiring that is provided in the first porous layer; and
   a trench wiring that is buried in the second porous layer,
   wherein the first porous layer has a pore density x1 of 40% or below and the second porous layer has a pore density x2 of (x1+5) % or above.

2. A method of manufacturing a semiconductor device, the method comprising:
   applying a first solution including a surfactant onto a substrate and heating the first solution to form a first porous layer;
   applying the first solution onto the first porous layer and heating the first solution to form a second porous layer; and
   providing a via wiring in the first porous layer and burying a trench wiring in the second porous layer after said forming the second porous layer.

3. The method of manufacturing a semiconductor device according to claim 2, wherein, in said forming the second porous layer, after the first solution is applied, the first solution is infiltrated into the first porous layer and is heated.

4. The method of manufacturing a semiconductor device according to claim 2,
   wherein, when the pore density of the first porous layer after said forming the first porous layer and before said forming the second porous layer is x1,0% and the pore density of the first porous layer after said forming the second porous layer is x1,1%, x1,1 is equal to 40% or below and x1,0 is equal to (x1,1+5) % or above.

5. The method of manufacturing a semiconductor device according to claim 2,
   wherein, in said forming the first porous layer and said forming the second porous layer, the heating is performed at a temperature equal to or higher than a thermal decomposition temperature of the surfactant.

6. The method of manufacturing a semiconductor device according to claim 2, further comprising:
   emitting at least one of ultraviolet rays, an electron beam, and microwaves to the first porous layer and the second porous layer while performing heating after said forming the second porous layer and before said forming the via wiring and the trench wiring.

7. The method of manufacturing a semiconductor device according to claim 2, further comprising:
   performing heating in an atmosphere including organic silicon in a gas molecule after said forming the second porous layer and before said forming the via wiring and the trench wiring.

* * * * *